(12) United States Patent
Perez

(10) Patent No.: US 11,139,824 B1
(45) Date of Patent: Oct. 5, 2021

(54) MAGNETO-OPTICAL CIRCUIT

(71) Applicant: Vulcan Inc., Seattle, WA (US)

(72) Inventor: Keith John Perez, Seattle, WA (US)

(73) Assignee: Vulcan Inc., Seattle, WA (US)

( * ) Notice: Subject to any disclaimer, the term of this patent is extended or adjusted under 35 U.S.C. 154(b) by 0 days.

(21) Appl. No.: 16/937,944

(22) Filed: Jul. 24, 2020

(51) Int. Cl.
*H03M 1/66* (2006.01)
*G01R 33/032* (2006.01)

(52) U.S. Cl.
CPC .......... *H03M 1/66* (2013.01); *G01R 33/0325* (2013.01)

(58) Field of Classification Search
CPC .............................. H03M 1/66; G01R 33/0325
USPC ......................................................... 341/144
See application file for complete search history.

(56) References Cited

U.S. PATENT DOCUMENTS

| | | | | |
|---|---|---|---|---|
| 5,502,373 | A * | 3/1996 | Ryczek | G01R 15/246 324/117 R |
| 5,654,723 | A * | 8/1997 | Craven | H01Q 1/36 343/742 |
| 6,281,672 | B1 * | 8/2001 | Terai | G01R 15/246 324/96 |
| 8,106,653 | B2 * | 1/2012 | Patterson | G01R 33/0325 324/244.1 |
| 8,324,894 | B2 * | 12/2012 | Diaz | G01N 27/9006 324/239 |
| 9,165,979 | B2 * | 10/2015 | Tran | G01N 27/122 |
| 2005/0230822 | A1 * | 10/2005 | Tran | G11C 13/04 257/735 |
| 2018/0159196 | A1 * | 6/2018 | Henry | H01Q 21/064 |
| 2018/0217117 | A1 * | 8/2018 | Tran | G11C 11/21 |

OTHER PUBLICATIONS

Abb, "MOCT Optical Current Transformer System for Metering 72.5-800 kV Systems, 50/60 Hz," T&D Products, Inc. Product Bulletin, retrieved Feb. 24, 2021, 3 pages.

* cited by examiner

*Primary Examiner* — Jean B Jeanglaude
(74) *Attorney, Agent, or Firm* — Davis Wright Tremaine LLP

(57) ABSTRACT

The processing of information is performed using a magneto-optic circuit that modifies the polarization of light using the Kerr effect. Magneto-optic circuits perform digital-to-analog conversion, comparison of values, and mathematical operations. Current carrying wires pass near a fiber-optic that carries polarized light. Each individual wire contributes a modification to the polarization of the light based on the current carried in each wire. The modified light is passed through a polarizer, and the intensity of the light may be measured with a photodiode to produce an electrical signal representing a result.

20 Claims, 6 Drawing Sheets

Magneto-Optic Digital to Analog Converter

MAGNETO-OPTICAL CIRCUIT

BACKGROUND

Electronic computing devices are used for a variety of purposes including analog signal processing, control of electronic and mechanical devices, and the processing of information. Most electronic computing devices are electronic in that they rely on electrical voltages and currents, combined with a variety of passive and active circuit components, to perform various switching and control functions. As such, the performance of many electronic devices is constrained by inductance, capacitance, and heat generation intrinsic to such devices. Those skilled in the art have generally advanced the performance of such devices by making devices more efficient, smaller, and less subject to these effects. Despite these gains, users continue to demand ever increasing amounts of performance. Additionally, performance gains are limited by boundaries defined by the laws of physics. Therefore, increasing the performance of electronic circuits continues to be an important problem.

BRIEF DESCRIPTION OF THE DRAWINGS

Various techniques will be described with reference to the drawings, in which.

DETAILED DESCRIPTION

Figure 1:
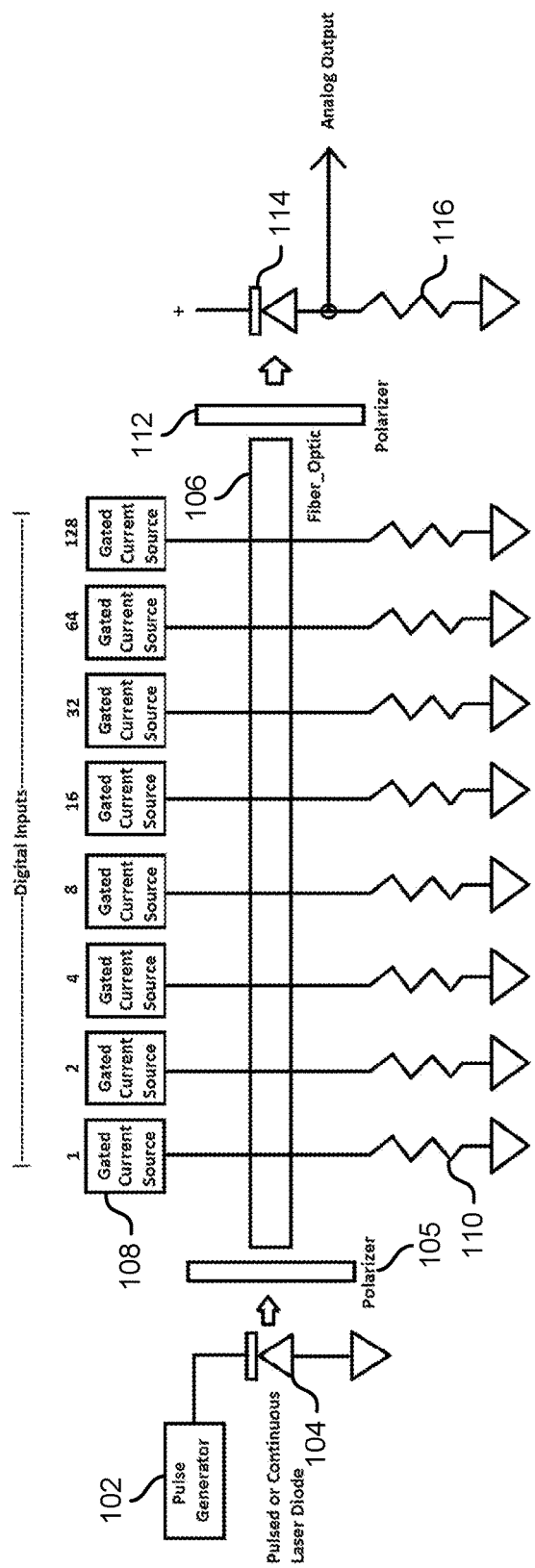
FIG. 1 illustrates an example of a digital-to-analog converter, in accordance with an embodiment.

Techniques and systems described below relate to the processing of electrical signals using a hybrid magneto-optical approach. In one example, polarized light is transmitted down an optical fiber. One or more electrical conductors through which various electrical currents are flowing, pass near the optical fiber, and the electric fields generated by the electrical currents change the polarization of the light in accordance with the Kerr effect (also called the magneto-optic effect ("MOKE") or Faraday effect). The resulting modified light can be passed through a polarizing filter and measured with a photodiode to produce an electrical analog output. Using the structure, high-speed digital to analog converters, comparators, and even digital logic circuits can be constructed as shown and illustrated below.

Various embodiments utilize the Kerr effect by causing a magnetic field, generated around a wire at a right angle to an optical fiber, to impinge on a length of the optical fiber, thereby changing the polarization of light traveling through the fiber. The polarization change (measured in degrees or radians), is proportional to the magnetic field radiated by the wire. In one example, the light from a laser diode passes through a polarizer, into the optical fiber, then through another polarizer, and is received by a photodiode. The amount of light detected is proportional to the amount of light received, and may be used to determine the amount of change in polarization of the light.

In one example, a digital to analog converter is created by converting a digital value into a set of binary bits, and converting each bit of information into a current using a resistor that limits the current to an amount proportional to the data value of the bit. For example, a four bit value can be converted to four currents of values 1 µA, 2 µA, 4 µA, and 8 µA. In another implementation, currents may be constant but a number of loops or passes may be used to generate a magnetic field proportional to the value of each bit. In yet another example, a combination of different current values and different numbers of turns may be used to achieve an equivalent effect. Depending on which bits are energized, polarized light passing down the optical conductor has its polarization modified by an amount that is proportional to the digital value. The resulting light is passed through a polarizer and then a photodiode is used to convert the light intensity to an electrical current that represents the analog value.

In another example, a digital comparator is constructed by using two sets of wires with corresponding wires in each set having opposing currents that generate opposing magnetic fields. The net magnetic field alters the polarization of polarized light transmitted down the optical conductor. A polarizer oriented at a right angle to the polarization of the light injected into the optical conductor is positioned at the exit of the optical conductor. If the digital values input into each set of wires match, the polarization of the light is unaffected, and no light exits the polarizer. If the digital values are not equal, the polarization of light is modified and at least some light passes through the polarizer and can be detected by a photodiode or other light detector.

In yet another example, the magneto optic circuit structures described above can be used to construct an arithmetic circuit such as an adder. In one implementation, a plurality of currents representing individual bits of values to be added pass in proximity to a fiber-optic conductor transmitting polarized light. The polarization of the polarized light is modified by magnetic and electric fields generated by the currents. The change to the polarization of light represents the total value represented by the currents. Passing in proximity is defined as being positioned such that the magnetic field generated by the current generates a magnetic field sufficient to have a measurable effect on the polarization of light in the optical conductor.

Techniques described and suggested in the present disclosure improve the field of computing, especially the field of digital computing, by using the Kerr effect to perform computations with polarized light. Additionally, techniques described and suggested in the present disclosure improve the speed of digital circuits by reducing the effects of capacitance, reluctance, and heat generation intrinsic to purely electronic circuits. Moreover, techniques described and suggested in the present disclosure are necessarily rooted in computer technology in order to overcome problems specifically arising with electronic circuits.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

FIG. 1 illustrates an example of a digital-to-analog converter, in accordance with an embodiment. In at least one embodiment, the digital to analog converter includes a pulse generator 102 coupled to a laser diode 104. In some examples, the laser diode 104 produces either continuous or pulsed light that generates coherent polarized light. In some examples, light emitted from the laser diode passes through a polarizer 105 that establishes a plane polarization for the light. In some examples, the polarizer can be a filter through which light passes. In other examples, the polarizer can be a reflective surface that reflects the light, causing the light to become polarized. Some implementations utilize a light-emitting diode which can emit light in the visible spectrum, infrared spectrum, or multiple points in the spectrum. Some implementations omit the pulse generator 102 and produce polarized light continuously.

The polarized light is injected into a light conductor such as a fiber-optic cable, a fiber-optic strand, or even a transparent empty space. A series of electrical conductors passes in proximity to the light conductor. Each conductor is coupled to a gated current source 108 and a resistor 110. In the example illustrated in FIG. 1, a series of gated current sources represent a series of data bits, and the amount of current produced by each gated current source is proportional to the numeric representation of its respective bit. For example, the low order bit of a digital value may be represented by a current of 1 µA, the second lowest order bit of a digital value may be represented by current of 2 µA, the third lowest order bit of a digital value may be represented by current of 4 µA, and so on. The series of electrical conductors passes in proximity to the light conductor, and for those conductors that carry electrical current, a magnetic field is generated that impinges on the optical conductor 106. The magnetic field induces a shift in polarization in accordance with the Kerr effect or the Faraday effect. The Kerr effect causes the polarization of light to be rotated in the presence of a magnetic field in the direction of that light by an amount proportional to the intensity of the magnetic field. Therefore, the polarization of the polarized light injected into the optical conductor rotates in proportion to the amount of the magnetic field in the direction of the travel of the light.

In at least one embodiment a set of digital inputs controls activation of the gated current sources 108. In the example illustrated in FIG. 1, eight gated current sources represent eight corresponding bits of a digital value, and the amount of current provided by each gated current source is proportional to the bid value of its respective bit. In some examples, the electrical conductor makes several passes or loops around the optical conductor 106 to increase the magnetic field imposed on the optical conductor. In this way, less current is necessary to represent higher numerical values. In various examples, a combination of variable current and a variable number of loops is used to establish the necessary change in polarization when the current sources are active. For example, with respect to the example above, a gated current source of 4 µA, or a gated current source of 1 µA combined with an electrical conductor having four loops can be used. In another example, a gated current source of 2 µA combined with an electrical conductor having two loops can be used. The gated current sources can be driven directly, or in some implementations, driven via amplifiers to couple logic-level digital signals to higher-level current signals.

In various examples, the polarized light travels down the optical conductor 106 to a polarizer 112. The polarizer 112 can be a fixed polarizer having an orientation that matches that of the input polarizer 105. As the light exits the optical conductor 106 and passes through the polarizer 112, the intensity of the light changes if the polarization of the light has been modified by the magnetic fields created by the gated current sources 108. In some examples, the intensity of the transmitted light is proportional to the cosine (if the second polarizer is oriented in line with the polarization of the injected light) or sine (if the second polarizer is oriented at a 90 degree angle to the injected light) of the angular change to the polarization of the light. Over suitably small ranges, the sine is linear around the origin, and the change in the intensity of light is approximately proportional to the change in intensity of the light passing through the polarizer 112. After passing through the polarizer 112, the intensity of the light is measured using a photodiode 114, or other light detector. The amount of current passing through the photodiode 114 is proportional to the intensity of the light, and the current passes through a resistor 116 which converts the current to an analog output voltage.

In some implementations, the polarizer 112 is mounted to a rotatable assembly such that the angle of the polarizer can be changed. By rotating the polarizer 112 and monitoring the output of the photodiode 114, a polarization angle corresponding to a maximum output voltage can be found. By measuring the polarization angle in this way, the system automatically compensates for variations in intensity loss, and variations in output intensity of the laser diode 104.

In another implementation, the polarized light exits the optical conductor 106 and passes through a beam splitter. Each branch of the beam passes through a separate polarizer, where the polarizers are oriented orthogonal to each other with respect to the polarization angles. The output of each polarizer is measured separately with separate photodiodes, and each resulting output voltage is proportional to the X and Y components of the polarization of the modified light.

Figure 2:
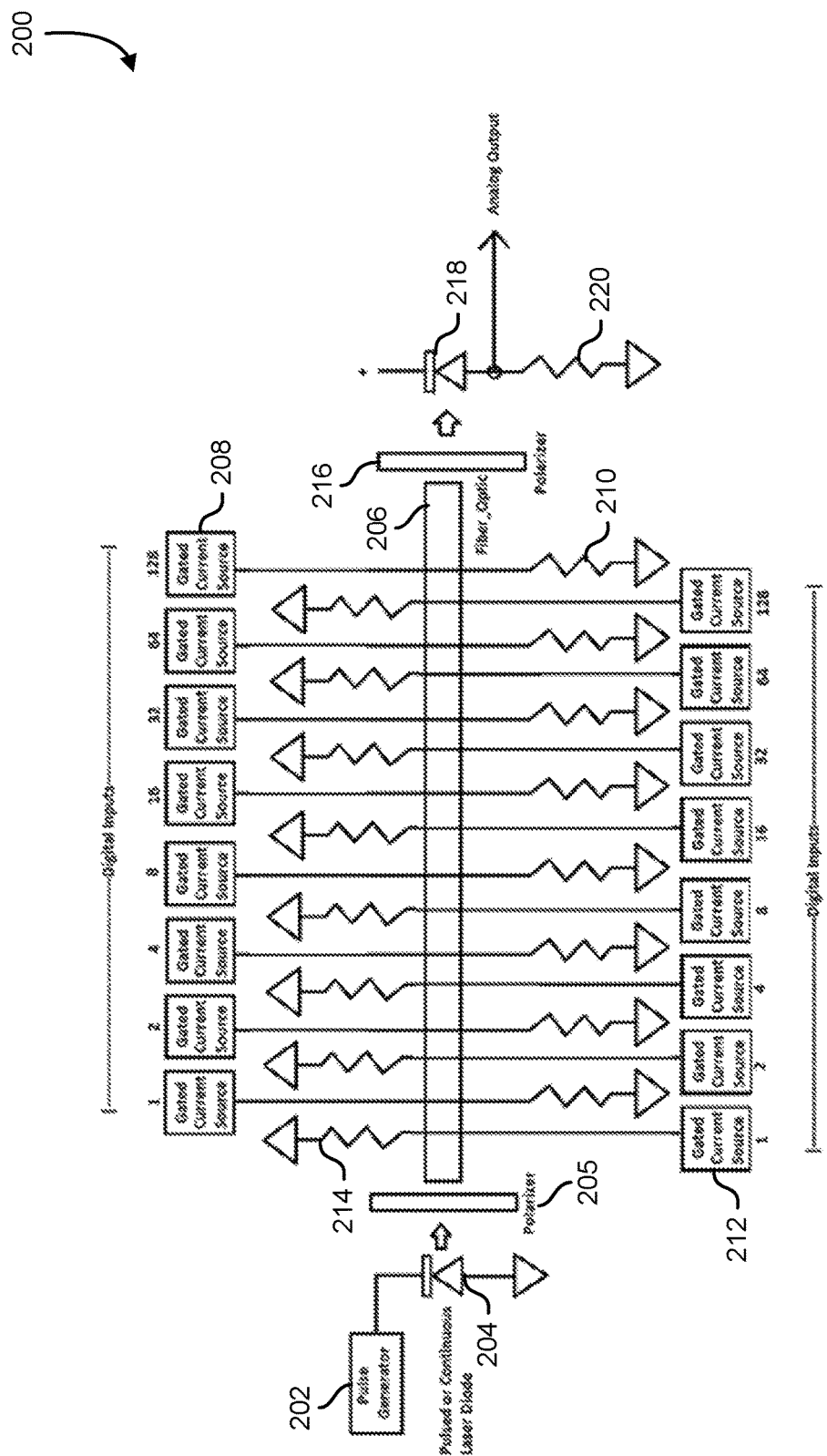
FIG. 2 illustrates an example of a comparator, in accordance with an embodiment.

FIG. 2 illustrates an example of a comparator, in accordance with an embodiment. A pulse generator 202 is coupled to a laser diode 204. In some examples, the laser diode 204 may be a pulsed laser diode or a continuous laser diode, and the pulse generator may be a pulsed current source or a continuous current source accordingly. Light emitted from the laser diode 204 is transmitted through a polarizer 205 which polarizes the light before light is injected into an optical conductor 206. The optical conductor can be a fiber-optic cable, lens, or even an empty space. In some examples, a light emitting diode that emits infrared, ultraviolet, or visible light is substituted for the laser diode 204. In some examples, the polarizer 205 is omitted and the laser diode 204 produces polarized light directly. In some examples, a reflective surface is used to polarize the light emitted from the laser diode 204, and the reflected light is directed into the optical conductor 206.

In the example shown in FIG. 2, the comparator includes two digital inputs. A first digital input is coupled to a first set of gated current sources 208 with an associated set of current-limiting resistors 210. A second digital input is coupled to a second set of gated current sources 212 and a second associated set of current limiting resistors 214. Each bit of each set of gated current sources produces a current representing the value of that bit. The presence of a current indicates one state of the bit, and the absence of a current indicates another state of the bit. In one implementation, the presence of a current indicates a one bit and the absence of the current indicates a zero bit. The value of each bit can be represented by either the amount of current produced by the respective gated current source or by a number of turns the current makes around the optical conductor 206. For example, a bit value representing the decimal number four can be represented by 4 µA traveling past the optical conductor 206 a single time, or by a current of 1 µA traveling past the optical conductor 206 four times. In one implementation, a fiber-optic conductor is wrapped around an electrical conductor such that the distance light travels through the magnetic field is increased, thereby increasing the Kerr effect based on the number of times the optical conductor is wrapped around the electrical conductor.

In the example shown in FIG. 2, the direction of current provided by the first set of gated current sources 208 and the second set of gated current sources 212 is opposite to one another. As a result, magnetic fields generated by the electrical currents of the respective gated current sources are in opposition to one another. If the same value is placed on the first set of gated current sources 208 and the second set of gated current sources 212, the magnetic fields that impinge on the optical conductor 206 cancel each other, and the impact on the polarization of the transmitted light through the optical conductor 206 is approximately zero. As a result, a second polarizer 216 can be used to determine whether the polarization of the transmitted light has been altered. In one implementation, the second polarizer 216 is placed in a rotation 90° from the orientation of the polarizer 205. When the polarization of the transmitted light is not modified, no light reaches a photodiode 218. If any of the bits of the input data are different from one another, there will be a net change to the polarization of light transmitted to the optical conductor 206, and light will be detected by the photodiode 218. By selecting the open resistor 220 to be a relatively high value, the analog output produces a large signal swing when any light is detected by the photodiode 218. In this way, a digital signal can be produced that indicates equivalency of the digital inputs to the magneto-optic comparator.

Similar techniques can be used to generate a magneto-optic circuit to perform addition or subtraction. In one implementation, the structure shown in FIG. 2 and described above can be used to produce an analog signal proportional to the difference between the first value driving the first set of gated current sources 208 and the second value driving the second set of gated current sources 212. If the polarizer 205 and the second polarizer 216 are oriented 90° out of phase from one another with respect to polarization, the resulting amount of light transmitted to the photodiode 218 will be approximately linearly related to the difference between the two values. Calibration of the system can be achieved by providing test inputs and measuring the output signal in order to determine a scale factor for conversion of the analog output back to a digital value.

In another implementation, the first set of gated current sources and the second set of gated current sources produce currents in the same direction, and the resulting light passing through the second polarizer 216 is proportional to the addition of the two values.

The change in the polarization of light represents an analog result, and therefore an arbitrary number of values and gated current sources may be used alter the polarization along the length of the optical conductor 206. For example, using three sets of gated current sources, three values can be added together to form a composite modified polarized light that can be measured in detected by the photodiode 218. By altering the direction of the current, multiple values can be added and or subtracted from each other, and the result measured by the photodiode 218.

In yet another implementation, multiplication can be accomplished using a digitally controlled current amplifier. By adding an amplifier stage to each gated current source, the amount of current provided by each control bit can be multiplied by the gain of the amplifier. The resulting increased current causes an increase in the change to the polarized light, resulting in a proportional change to the analog output produced by the photodiode 218. In some implementations, the current amplifier can be implemented using a MOSFET transistor, an operational amplifier or a digital to analog converter.

Figure 3:
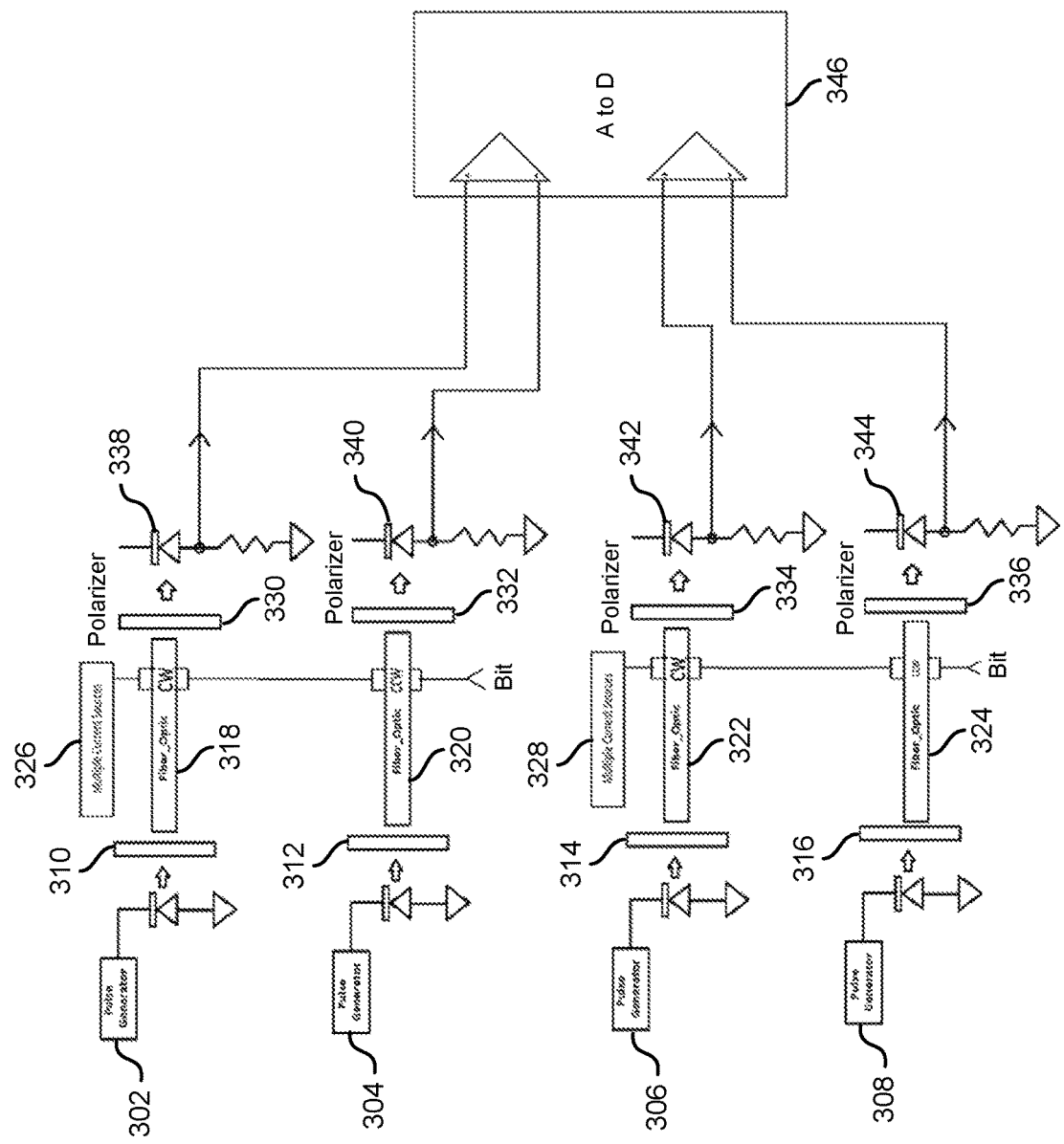
FIG. 3 illustrates an example of an adder, in accordance with an embodiment.

FIG. 3 illustrates an example of an adder, in accordance with an embodiment. In at least one embodiment, the outer includes four light emitters 302, 304, 306, 308. Each light emitter includes a pulse generator coupled to a laser diode. Light from each light emitter is transmitted through an input polarizer 310, 312, 314, and 316. The polarizers impose a planar polarization to the light before light is directed into an optical conductor 318, 320, 322, or 324. A pair of current sources 326 and 328, direct current through a set of electrical conductors past the optical conductor's 318, 320, 322, and 324. Magnetic fields created by the set of electrical conductors cause changes in the polarizations of light transmitted down the optical conductor's 318, 320, 322, and 324.

A second set of polarizers 330, 332, 334, 336 are positioned at the exit of the optical conductor's 318, 320, 322, and 324. The second set of polarizers 330, 332, 334, 336 are oriented so that the polarization is in a 90° angle to the polarization of the first set of polarizers 310, 312, 314, and 316. The more the polarization of the light within the optical conductor is rotated, the more light passes through the second set of polarizers. If, for example, the light is not modified when passing down the optical conductor, no light passes through the second set of polarizers.

Light that passes through the second set of polarizers 330, 332, 334, and 336 is detected by a set of photodiodes 338, 340, 342, 344. The amount of current conducted through the individual photodiodes is proportional to the amount of light that is transmitted through the respective polarizer in the second set of polarizers 330, 332, 334, 336. As a result of the current conducted through the respective photodiode, a voltage is induced across a resistor, and that voltage is provided to an analog to digital converter 346. In one embodiment, the analog to digital converter is a two channel differential ADD converter that produces two separate digital outputs.

Figure 4:
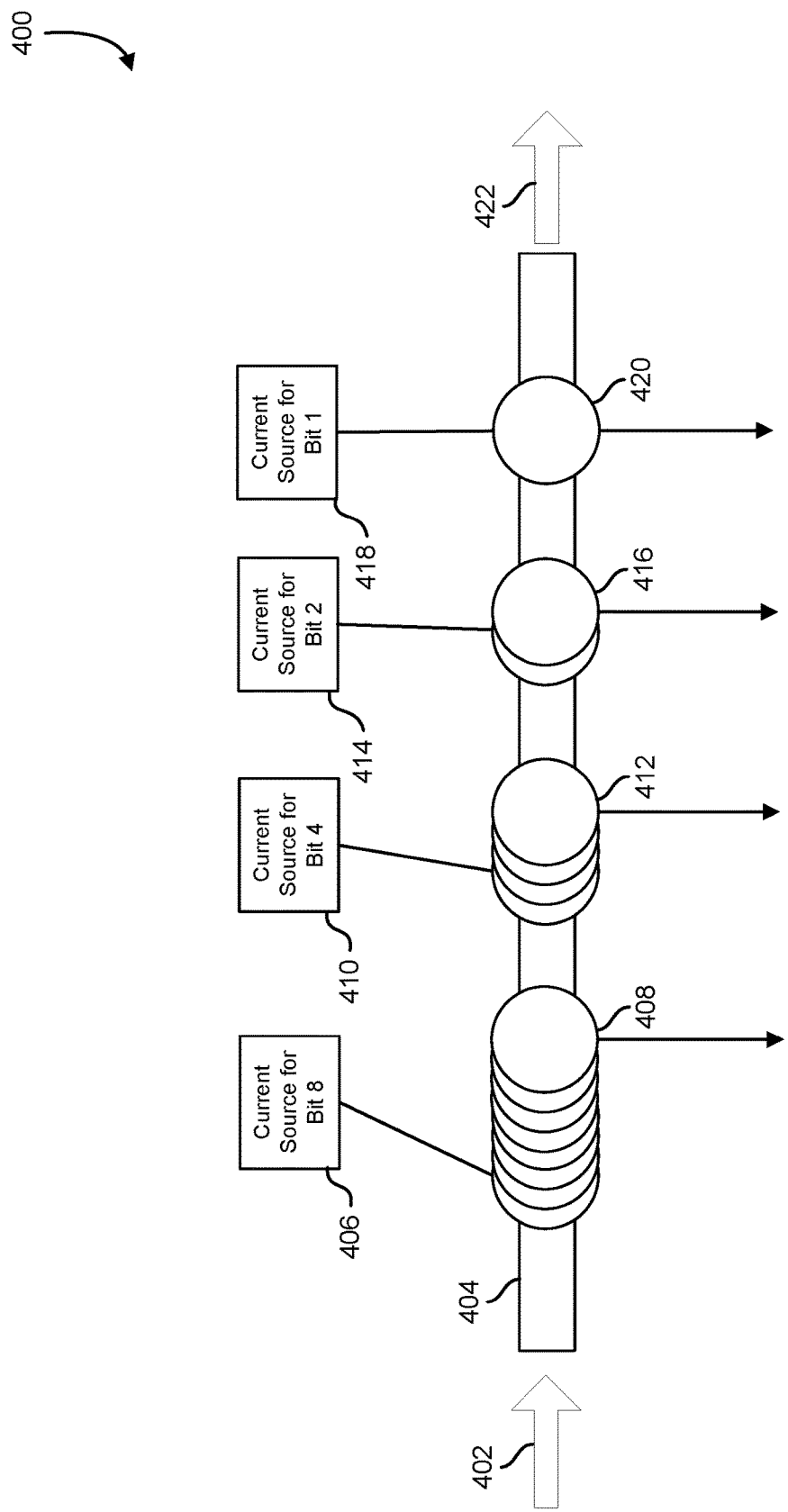
FIG. 4 illustrates an example of a magneto-optic circuit, in accordance with an embodiment.

FIG. 4 illustrates an example of a magneto-optic circuit, in accordance with an embodiment. In some examples, modification of the polarization of light through an optical conductor can be accomplished by providing multiple raps of the conductor around the optical conductor instead of or in combination with variable currents that represent different bit values. In the example illustrated in FIG. 4, polarized light 402 is injected into an optical conductor 404. The optical conductor 404 can be an air space, a fiber-optic cable, or transparent material. The light is polarized in a planar fashion. A set of gated current sources provide current to a set of conductors, and each current source is gated by a bit of a binary value. A first gated current source 418 represents the ones place of the binary value. A second gated current source 414 represents the twos place of the binary value. A third gated current source 410 represents the fours place of the binary value. A fourth gated current source 406 represents the eights place of the binary value.

In at least one example, each gated current source produces an equivalent current, but the current takes a variable number of loops or turns around the optical conductor 404 before traveling to ground. In the example illustrated in FIG. 4, current from the first gated current source 418 travels through an electrical conductor 420 that makes one turn around the optical conductor 404. Current from the second gated current source 414 passes through an electrical conductor 416 that makes two turns around the optical conductor 404. The number of turns in each conductor is proportional to the value of the bit represented by the gated current source. In one example, the electrical conductor 420 has a single turn around the optical conductor 404, the electrical conductor 416 has two turns around the optical conductor 404, the electrical conductor 412 has four turns around the optical conductor 404, and the electrical conductor 408 has eight turns around the optical conductor 404. The additional turns around the optical conductor increase the amount of magnetic field that impinges on the optical conductor 404 proportional to the number of turns and therefore increases the change in polarization of the light 402 transmitted through the optical conductor 404.

In at least one embodiment, as described above, light exiting the optical conductor 422 is transmitted through the second polarizer oriented at right angles to the polarization of the injected light 402. The amount of light that exits from the optical conductor is approximately proportional to the angular change in the polarization of the input light 402 induced by the magnetic fields which are in turn generated by the gated current sources 418, 414, 410, and 406. Some examples are a combination of turns around the optical conductor and variations in the amount of current through the electrical conductor to achieve an effect on the polarization proportional to the bit value of a respective current source. For example, some examples might double the amount of current and double the amount of turns to achieve a quadrupling of the effect on the polarization of the injected light 402.

Figure 5:
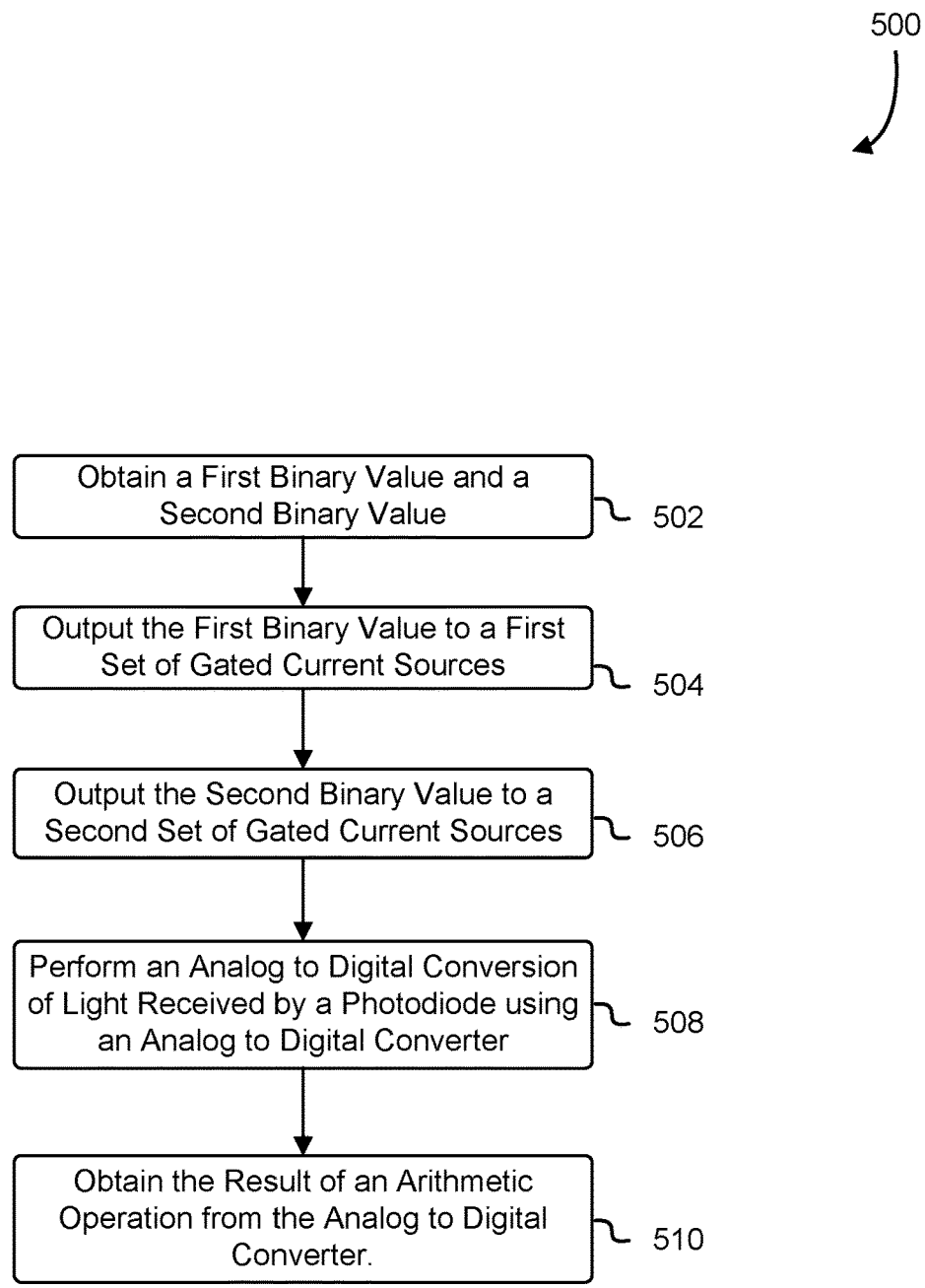
FIG. 5 illustrates an example of a process that, as a result of being performed by a computer system, performs an arithmetic operation, in accordance with an embodiment.

FIG. 5 illustrates an example of a process that, as a result of being performed by a computer system, performs an arithmetic operation using a magneto-optic circuit, in accordance with an embodiment. FIG. 5 is a flowchart illustrating an example of a process 500 for performing an arithmetic function such as addition or subtraction, in accordance with various embodiments. Some or all of the process 500 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer program persistently stored on magnetic, optical, or flash media).

Figure 6:
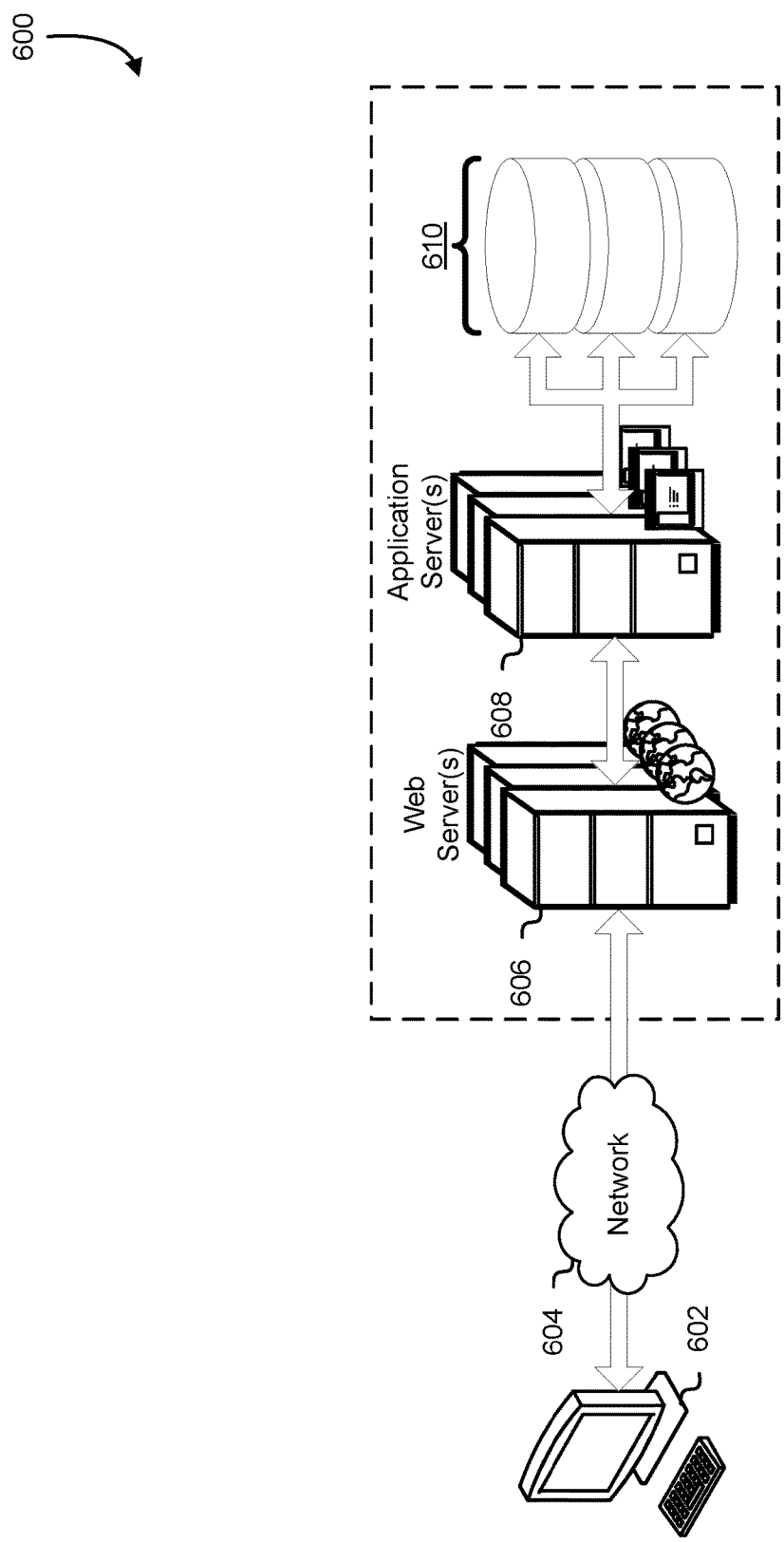
FIG. 6 illustrates an environment in which various embodiments can be implemented.

For example, some or all of process 500 may be performed by any suitable system, such as a server in a data center, by various components of the environment 600 described in conjunction with FIG. 6, such as the one or more web servers 606 or the one or more application servers 608, by multiple computing devices in a distributed system of a computing resource service provider, or by any electronic client device such as the electronic client device 602. The process 500 includes a series of operations wherein digital data is transformed to a set of currents that alter the polarization of light transmitted through an optical conductor.

In one example, at block 502, the computer system obtains the first binary value and a second binary value. The first binary value and the second binary value may be parameters to an arithmetic operation. In some examples the first binary value and the second binary value may be two of a larger number of parameters to the arithmetic operation. For example, the first binary value and the second binary value may be two binary values to be added. In another example, the first binary value and the second binary value may be two binary values to be subtracted. The binary values can be any number of bits such as eight, 16, 32, or 64 bit parameters. In one implementation, the binary values are retrieved from computer-readable memory accessible to the computer system.

At block 504, the first binary value is output to a first set of gated current sources. The gated current sources can be implemented as described above. In one example, each bit of the first binary value is used to control an individual gated current source. The presence or absence of current produced by the gated current source is determined by the one or zero value in a respective bit of the first binary value.

At block 506, the second binary value is output to a second set of gated current sources. The gated current sources can be implemented as described above, and may provide current in the same direction or an opposing direction to the first set of gated current sources, depending on the arithmetic operation to be performed. Each bit of the second binary value is used to control individual gated current source in the second set of gated current sources. Individual bits of the second binary value determine the presence or absence of current produced by each respective individual gated current source.

At block 508, the computer system performs an analog-to-digital conversion, or the analog value is produced as a result of light being received by a photodiode. The analog-to-digital conversion produces a result that, in some implementations, is the result of the arithmetic operation. In some implementations, the result of the analog-to-digital conversion is scaled to adjust the range of the conversion to the range of the expected results. In some examples, temperature compensation, or truncation, is used to improve the accuracy of the result. In one implementation, the system calibrates the conversion by performing an arithmetic operation with a known result representing the extremes of the expected range. For example, to calibrate a circuit that performs 8-bit additions, the computer system may perform an addition of 0+0 and another addition of 256+256, to establish the range of results produced by the analog-to-digital conversion.

At block 510, the result of the arithmetic operation is retrieved from the analog-to-digital converter. In some examples, the result is retrieved directly and provided to the computer system. In other examples, the result is scaled or adjusted as described above and then provided to the computer system.

Note that one or more of the operations performed above may be performed in various orders and combinations, including in parallel.

Note that, in the context of describing disclosed embodiments, unless otherwise specified, use of expressions regarding executable instructions (also referred to as code, applications, agents, etc.) performing operations that "instructions" do not ordinarily perform unaided (e.g., transmission of data, calculations, etc.) denote that the instructions are being executed by a machine, thereby causing the machine to perform the specified operations.

FIG. 6 illustrates aspects of an example environment 600 for implementing aspects in accordance with various embodiments. As will be appreciated, although a web-based environment is used for purposes of explanation, different environments may be used, as appropriate, to implement various embodiments. The environment includes an electronic client device 602, which can include any appropriate device operable to send and/or receive requests, messages, or information over an appropriate network 604 and convey information back to a user of the device. Examples of such client devices include personal computers, cell phones, handheld messaging devices, laptop computers, tablet computers, set-top boxes, personal data assistants, embedded computer systems, electronic book readers, and the like.

The environment 600 in one embodiment is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than those illustrated in FIG. 6. Thus, the depiction in FIG. 6 should be taken as being illustrative in nature and not limiting to the scope of the disclosure.

The network 604 can include any appropriate network, including an intranet, the Internet, a cellular network, a local area network, a satellite network or any other network, and/or combination thereof. Components used for such a system can depend at least in part upon the type of network and/or environment selected. Many protocols and components for communicating via such network 604 are well known and will not be discussed in detail. Communication over the network 604 can be enabled by wired or wireless connections and combinations thereof. In an embodiment, the network 604 includes the Internet and/or other publicly-addressable communications network, as the environment 600 includes one or more web servers 606 for receiving requests and serving content in response thereto, although for other networks an alternative device serving a similar purpose could be used as would be apparent to one of ordinary skill in the art.

The illustrative environment 600 includes one or more application servers 608 and data storage 610. It should be understood that there can be several application servers, layers or other elements, processes or components, which may be chained or otherwise configured, which can interact to perform tasks such as obtaining data from an appropriate data store. Servers, as used, may be implemented in various ways, such as hardware devices or virtual computer systems. In some contexts, "servers" may refer to a programming module being executed on a computer system. As used, unless otherwise stated or clear from context, the term "data store" or "data storage" refers to any device or combination of devices capable of storing, accessing, and retrieving data, which may include any combination and number of data servers, databases, data storage devices, and data storage media, in any standard, distributed, virtual, or clustered environment.

The one or more application servers 608 can include any appropriate hardware, software and firmware for integrating with the data storage 610 as needed to execute aspects of one or more applications for the electronic client device 602, handling some or all of the data access and business logic for an application. The one or more application servers 608 may provide access control services in cooperation with the data storage 610 and is able to generate content including text, graphics, audio, video, and/or other content usable to be provided to the user, which may be served to the user by the one or more web servers 606 in the form of HyperText Markup Language (HTML), Extensible Markup Language (XML), JavaScript, Cascading Style Sheets (CS S), JavaScript Object Notation (JSON), and/or another appropriate client-side structured language. Content transferred to the electronic client device 602 may be processed by the electronic client device 602 to provide the content in one or more forms including forms that are perceptible to the user audibly, visually, and/or through other senses. The handling of all requests and responses, as well as the delivery of content between the electronic client device 602 and the one or more application servers 608, can be handled by the one or more web servers 606 using PHP: Hypertext Preprocessor (PHP), Python, Ruby, Perl, Java, HTML, XML, JSON, and/or another appropriate server-side structured language in this example. Further, operations described as being performed by a single device may, unless otherwise clear from context, be performed collectively by multiple devices, which may form a distributed and/or virtual system.

Each server typically will include an operating system that provides executable program instructions for the general administration and operation of that server and typically will include a computer-readable storage medium (e.g., a hard disk, random access memory, read only memory, etc.) storing instructions that, when executed (i.e., as a result of being executed) by a processor of the server, allow the server to perform its intended functions.

The data storage 610 can include several separate data tables, databases, data documents, dynamic data storage schemes, and/or other data storage mechanisms and media for storing data relating to a particular aspect of the present disclosure. For example, the data storage 610 may include mechanisms for storing various types of data and user information 616, which can be used to serve content to the electronic client device 602. The data storage 610 also is shown to include a mechanism for storing log data, such as application logs, system logs, access logs, and/or various other event logs, which can be used for reporting, analysis, or other purposes. It should be understood that there can be many other aspects that may need to be stored in the data storage 610, such as page image information and access rights information, which can be stored in any of the above listed mechanisms as appropriate or in additional mechanisms in the data storage 610. The data storage 610 is operable, through logic associated therewith, to receive instructions from the one or more application servers 608 and obtain, update, or otherwise process data in response thereto. The one or more application servers 608 may provide static, dynamic, or a combination of static and dynamic data in response to the received instructions. Dynamic data, such as data used in web logs (blogs), shopping applications, news services, and other applications may be generated by server-side structured languages as described or may be provided by a content management system (CMS) operating on, or under the control of, the one or more application servers 608.

In one embodiment, a user, through a device operated by the user, can submit a search request for a match to a particular search term. In this embodiment, the data storage 610 might access the user information to verify the identity of the user and obtain information about items of that type. The information then can be returned to the user, such as in a results listing on a web page that the user is able to view via a browser on the electronic client device 602. Information related to the particular search term can be viewed in a dedicated page or window of the browser. It should be noted, however, that embodiments of the present disclosure are not necessarily limited to the context of web pages, but may be more generally applicable to processing requests in general, where the requests are not necessarily requests for content.

The various embodiments further can be implemented in a wide variety of operating environments, which in some embodiments can include one or more user computers, computing devices, or processing devices that can be used to operate any of a number of applications. User or client devices can include any of a number of computers, such as desktop, laptop, or tablet computers running a standard operating system, as well as cellular, wireless, and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems, and other devices capable of communicating via the network 604. These devices also can include virtual devices such as virtual machines, hypervisors, and other virtual devices capable of communicating via the network 604.

Various embodiments of the present disclosure utilize the network 604 that would be familiar to those skilled in the art for supporting communications using any of a variety of commercially available protocols, such as Transmission Control Protocol/Internet Protocol (TCP/IP), User Datagram Protocol (UDP), protocols operating in various layers of the Open System Interconnection (OSI) model, File Transfer Protocol (FTP), Universal Plug and Play (UpnP), Network File System (NFS), and Common Internet File System (CIFS). The network 604 can be, for example, a local area network, a wide-area network, a virtual private network, the Internet, an intranet, an extranet, a public switched telephone network, an infrared network, a wireless network, a satellite network, and any combination thereof. In some embodiments, connection-oriented protocols may be used to communicate between network endpoints. Connection-oriented protocols (sometimes called connection-based protocols) are capable of transmitting data in an ordered stream. Connection-oriented protocols can be reliable or unreliable. For example, the TCP protocol is a reliable connection-oriented protocol. Asynchronous Transfer Mode (ATM) and Frame Relay are unreliable connection-oriented protocols. Connection-oriented protocols are in contrast to packet-oriented protocols such as UDP that transmit packets without a guaranteed ordering.

In embodiments utilizing the one or more web servers 606, the one or more web servers 606 can run any of a variety of server or mid-tier applications, including Hypertext Transfer Protocol (HTTP) servers, FTP servers, Common Gateway Interface (CGI) servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python, or TCL, as well as combinations thereof. The server(s) may also include database servers, including those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers, or combinations of these and/or other database servers.

The environment 600 can include a variety of data stores and other memory and storage media as discussed above. These can reside in a variety of locations, such as on a storage medium local to (and/or resident in) one or more of the computers or remote from any or all of the computers across the network 604. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, a central processing unit (CPU or processor), an input device (e.g., a mouse, keyboard, controller, touch screen, or keypad), and an output device (e.g., a display device, printer, or speaker). Such a system may also include one or more storage devices, such as disk drives, optical storage devices, and solid-state storage devices such as random access memory (RAM) or read-only memory (ROM), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within a working memory device, including an operating system and application programs, such as a client application or web browser. In addition, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as volatile and non-volatile, removable and non-removable media implemented in any method or technology for storage and/or transmission of information such as computer readable instructions, data structures, program modules, or other data, including RAM, ROM, Electrically Erasable Programmable Read-Only Memory (EEPROM), flash memory or other memory technology, Compact Disc Read-Only Memory (CD-ROM), digital versatile disk (DVD), or other optical storage, magnetic cassettes, magnetic tape, magnetic disk storage, or other magnetic storage devices, or any other medium which can be used to store the desired information and which can be accessed by the system device. Based on the disclosure and teachings provided, a person of ordinary skill in the art will appreciate other ways and/or methods to implement the various embodiments.

The specification and drawings are, accordingly, to be regarded in an illustrative rather than a restrictive sense. However, it will be evident that various modifications and changes may be made thereunto without departing from the broader spirit and scope of the invention as set forth in the claims. Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a," "an," "the," and similar referents in the context of describing the disclosed embodiments (especially in the context of the following claims) are to be construed to cover both the singular and the plural, unless otherwise indicated or clearly contradicted by context. The terms "comprising," "having," "including," and "containing" are to be construed as open-ended terms (i.e., meaning "including, but not limited to,") unless otherwise noted. The term "connected," where unmodified and referring to physical connections, is to be construed as partly or wholly contained within, attached to, or joined together, even if there is something intervening. Recitation of ranges of values is merely intended to serve as a shorthand method of referring individually to each separate value falling within the range, unless otherwise indicated, and each separate value is incorporated into the specification as if it were individually recited. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," is understood with the context as used in general to present that an item, term, etc., may be either A or B or C, or any nonempty subset of the set of A and B and C, unless specifically stated otherwise or otherwise clearly contradicted by context. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). The number of items in a plurality is at least two but can be more when so indicated either explicitly or by context.

Operations of processes described can be performed in any suitable order unless otherwise indicated or otherwise clearly contradicted by context. Processes described (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising instructions executable by one or more processors. The computer-readable storage medium may be non-transitory. In some embodiments, the code is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media may comprise multiple non-transitory computer-readable storage media, and one or more of individual non-transitory storage media of the multiple non-transitory computer-readable storage media may lack all of the code while the multiple non-transitory computer-readable storage media collectively store all of the code. Further, in some embodiments, the executable instructions are executed such that different instructions are executed by different processors. As an illustrative example, a non-transitory computer-readable storage medium may store instructions. A main CPU may execute some of the instructions and a graphics processor unit may execute other of the instructions. Generally, different components of a computer system may have separate processors and different processors may execute different subsets of the instructions.

Accordingly, in some embodiments, computer systems are configured to implement one or more services that singly or collectively perform operations of processes described herein. Such computer systems may, for instance, be configured with applicable hardware and/or software that enable the performance of the operations. Further, computer systems that implement various embodiments of the present disclosure may, in some embodiments, be single devices and, in other embodiments, be distributed computer systems comprising multiple devices that operate differently such that the distributed computer system performs the operations described and such that a single device may not perform all operations.

The use of any examples, or exemplary language (e.g., "such as") provided, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for embodiments of the present disclosure to be practiced otherwise than as specifically described. Accordingly, the scope of the present disclosure includes all modifications and equivalents of the subject matter recited in the claims appended hereto as permitted by applicable law. Moreover, although above-described elements may be described in the context of certain embodiments of the specification, unless stated otherwise or otherwise clear from context, these elements are not mutually exclusive to only those embodiments in which they are described; any combination of the above-described elements in all possible variations thereof is encompassed by the scope of the present disclosure unless otherwise indicated or otherwise clearly contradicted by context.

All references, including publications, patent applications, and patents, cited are hereby incorporated by reference to the same extent as if each reference were individually and specifically indicated to be incorporated by reference and were set forth in its entirety.

What is claimed is:

1. A method, comprising:
   transmitting polarized light through an optical conductor;

providing a plurality of electrical currents to pass through respective electrical conductors, each current of the plurality of electrical currents representing a value to be accumulated;

causing the plurality of electrical currents to pass in proximity to the optical conductor, thereby causing a modification to polarization of the polarized light as a result of electromagnetic fields produced by the plurality of electrical currents; and measuring the modification to the polarization to determine an accumulation of the values.

2. The method of claim 1, wherein each current in the plurality of currents represents a bit in a binary value.

3. The method of claim 1, wherein measuring the modification is accomplished by at least passing the modified polarized light through a polarizer and measuring the intensity of light transmitted through the polarizer.

4. The method of claim 1, wherein measuring the modification is accomplished by rotating a polarizer and determining an angle of rotation that maximizes the intensity of light transmitted through the polarizer.

5. A system, comprising:
one or more processors; and
memory including executable instructions that, if executed by the one or more processors, cause the system to:
cause a plurality of electrical currents each representing a value to pass in proximity to an optical conductor, thereby causing polarization of polarized light to be modified by electromagnetic fields produced by the plurality of electrical currents; and
obtain a measurement of modification of the polarization; and
determine, based on the measurement, output of a function based on values represented by currents of the plurality of electrical currents.

6. The system of claim 5, wherein:
the plurality of electrical currents represents two values, and
the measurement indicates whether the two values match.

7. The system of claim 5, wherein:
the plurality of electrical currents includes a first set of electrical currents and a second set of electrical currents;
the first set of electrical currents represents a first value;
the second set of electrical currents represents second value; and
the measurement indicates a sum of the first value and the second value.

8. The system of claim 7, wherein:
the plurality of electrical currents includes a third set of electrical currents;
the third set of electrical currents represents a third value;
the measurement indicates a sum of the first value and the second value and the third value.

9. The system of claim 5, wherein:
the plurality of electrical currents includes a first set of electrical currents and a second set of electrical currents;
the first set of electrical currents represents a first value;
the second set of electrical currents represents second value; and
the measurement indicates a difference between the first value and the second value.

10. The system of claim 5, wherein:
the plurality of electrical currents include a set of currents in a corresponding set of wires; and
each current in the set of currents represents a bit of a value.

11. The system of claim 5, wherein the polarized light is linearly polarized in a first plane.

12. The system of claim 11, wherein:
the modified polarized light is polarized in a second plane; and
the measurement is proportional to an angle between the first plane and the second plane.

13. A magneto-optic circuit comprising:
a light emitter capable of injecting polarized light into an optical conductor coupled to the light emitter;
a plurality of electrical conductors positioned relative to the optical conductor that, when energized with electric current, produce an electromagnetic field that modifies the polarization of the polarized light transmitted through the optical conductor; and
a light detector positioned to receive light transmitted through a polarizer.

14. The magneto-optic circuit of claim 13, wherein the polarizer is coupled to a mechanism to rotate the polarizer around an axis parallel to the optical conductor.

15. The magneto-optic circuit of claim 13, wherein the light detector is a photodiode, solar cell, or photo resistor.

16. The magneto-optic circuit of claim 13, wherein the optical conductor is a fiber optic strand.

17. The magneto-optic circuit of claim 13, wherein:
each electrical conductor has a respective number of turns around the optical conductor; and
the number of turns is proportional to a numerical value that a current in the electrical conductor represents.

18. The magneto-optic circuit of claim 13, wherein the light emitter is a laser diode.

19. The magneto-optic circuit of claim 13, wherein the light emitter is a light emitting diode coupled to a polarizing filter oriented to linearly polarize light produced by the light emitting diode.

20. The magneto-optic circuit of claim 13, further comprising an analog to digital converter connected to an electrical output of the light detector.

* * * * *